US 9,041,584 B2

(12) United States Patent
Wang et al.

(10) Patent No.: US 9,041,584 B2
(45) Date of Patent: May 26, 2015

(54) DUAL-PATH COMPARATOR AND METHOD

(71) Applicant: Silicon Laboratories Inc., Austin, TX (US)

(72) Inventors: Xiaodong Wang, Austin, TX (US); Shouli Yan, Austin, TX (US); Axel Thomsen, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 14/016,948

(22) Filed: Sep. 3, 2013

(65) Prior Publication Data

US 2015/0061913 A1  Mar. 5, 2015

(51) Int. Cl.
*H03M 1/12* (2006.01)
*H03M 1/42* (2006.01)
*H03M 1/38* (2006.01)
*H03M 1/40* (2006.01)

(52) U.S. Cl.
CPC  *H03M 1/42* (2013.01); *H03M 1/38* (2013.01); *H03M 1/403* (2013.01)

(58) Field of Classification Search
CPC ......... H03M 1/001; H03M 1/14; H03M 1/34; H03M 1/38; H03M 1/40; H03M 1/403; H03M 1/462; H03M 1/466; H03M 1/468; H03M 1/804
USPC ................................................ 341/172, 163
See application file for complete search history.

(56) References Cited

U.S. PATENT DOCUMENTS

| | | | | |
|---|---|---|---|---|
| 5,006,853 | A * | 4/1991 | Kiriaki et al. | 341/156 |
| 5,831,562 | A * | 11/1998 | Van Auken et al. | 341/122 |
| 8,159,382 | B2 * | 4/2012 | Srinivasa et al. | 341/156 |
| 8,258,991 | B2 * | 9/2012 | Janakiraman | 341/161 |
| 2013/0009800 | A1 | 1/2013 | Yang et al. | |

OTHER PUBLICATIONS

T.L. Tewksbury and H.S. Lee, "Characterization, Modeling, and Minimization of Transient Threshold Voltage Shifts n MOSFET's," IEEE JSSC, vol. 29, pp. 239-252, Mar. 1994.

* cited by examiner

*Primary Examiner* — Khai M Nguyen
(74) *Attorney, Agent, or Firm* — Cesari & Reed LLP; R. Michael Reed

(57) ABSTRACT

A method includes receiving a differential voltage signal at first and second inputs of a comparator and selectively providing the differential voltage signal to one of a first conversion path and a second conversion path of the comparator during a conversion phase to determine a digital value corresponding to the differential voltage signal. The first and second conversion paths including first and second pluralities of gain stages, respectively. The method further includes coupling the selected one of the first conversion path and the second conversion path to an output to provide the digital value.

20 Claims, 6 Drawing Sheets

DUAL-PATH COMPARATOR AND METHOD

FIELD

The present disclosure is generally related to comparators, and more particularly to comparators for use in high-accuracy applications.

BACKGROUND

In analog-to-digital converter (ADC) circuits, input values may be compared to a reference to determine a corresponding digital value. The conversion process may be performed iteratively, to determine a plurality of bit values. The number of bits determines the resolution or accuracy of the ADC. ADCs and other analog circuits may sometimes experience transient metal oxide semiconductor (MOS) threshold voltage ($V_T$) shifts due to large and unbalanced gate-to-source voltage ($V_{GS}$) stress, which may affect the resolution.

SUMMARY

In an embodiment, a method includes receiving a differential voltage signal at first and second inputs of a comparator and selectively providing the differential voltage signal to one of a first conversion path and a second conversion path of the comparator during a conversion phase to determine a digital value corresponding to the differential voltage signal. The first and second conversion paths including first and second pluralities of gain stages, respectively. The method further includes coupling the selected one of the first conversion path and the second conversion path to an output to provide the digital value.

In another embodiment, a dual-path comparator includes first and second inputs to receive a differential input signal, and includes a first path including a first plurality of gain stages and a second path including a second plurality of gain stages. The first path is configured to be coupled to the first and second inputs during a first portion of a conversion period, and the second path is configured to be coupled to the first and second inputs during a second portion of a conversion period. The dual-path comparator further includes an output switch configured to selectively couple one of the first path and the second path to an output node.

In still another embodiment, an analog-to-digital converter includes first and second inputs to receive a differential input signal, a first path configured to be coupled to the first and second inputs during a first portion of a conversion period, and a second path configured to be coupled to the first and second inputs during a second portion of a conversion period. The analog-to-digital converter further includes a path switch configured to couple the first and second inputs to the first path during the first portion and to couple the first and second inputs to the second path during the second portion.

BRIEF DESCRIPTION OF THE DRAWINGS

In the following discussion, the same reference numbers are used in the various embodiments to indicate the same or similar elements.

DETAILED DESCRIPTION OF ILLUSTRATIVE EMBODIMENTS

In some examples, MOS oxide traps may retain charge that may cause unintended activation of the MOS channels. Such unintended activation may limit the accuracy of a successive approximation register analog-to-digital converter (SAR ADC). For a 16-bit SAR ADC, such shifts can limit the SAR ADC accuracy to about 11 or 12 bits.

Embodiments of a dual-path comparator are described below that may be used in a SAR ADC. The dual-path comparator includes a coarse path and a fine path as well as a corresponding switching architecture for selecting between the coarse and fine paths. In an example, the comparator may be configured to switch the input signal to the coarse path during the initial (few) comparison steps that correspond to the most significant bits (MSBs), when the differential input voltage is relatively large. During conversion of the MSBs, the input stage of the fine path may be disabled so that its input devices will not see large VGS stress, and the coarse path is used to carry out the conversion. As the differential input voltage decreases, the fine path input stage may be enabled, and the comparator may switch the input signal to the fine path to convert the remaining bits to determine the least significant bits (LSBs). Furthermore, clamps may be added at the output of the first a few stages in the fine path and may be configured to reduce stress on the following stages in the fine path.

Further, the comparator uses a radix less than two, at least at the initial MSB transitions, to provide extra redundancy to account for mismatch errors in the coarse and fine paths. By utilizing the dual-path architecture to determine the bit values, the coarse path may be stressed and may demonstrate the transient MOS threshold voltage shift, but the transient MOS threshold shift can be eliminated when the fine path is enabled to finish the conversion, as long as the error is smaller than the redundancy introduced by the radix less than two The fine path determines the resolution (accuracy) of the SAR ADC. One embodiment of an SAR ADC in which a dual-path comparator may be used is described below with respect to FIG. 1.

Figure 1:
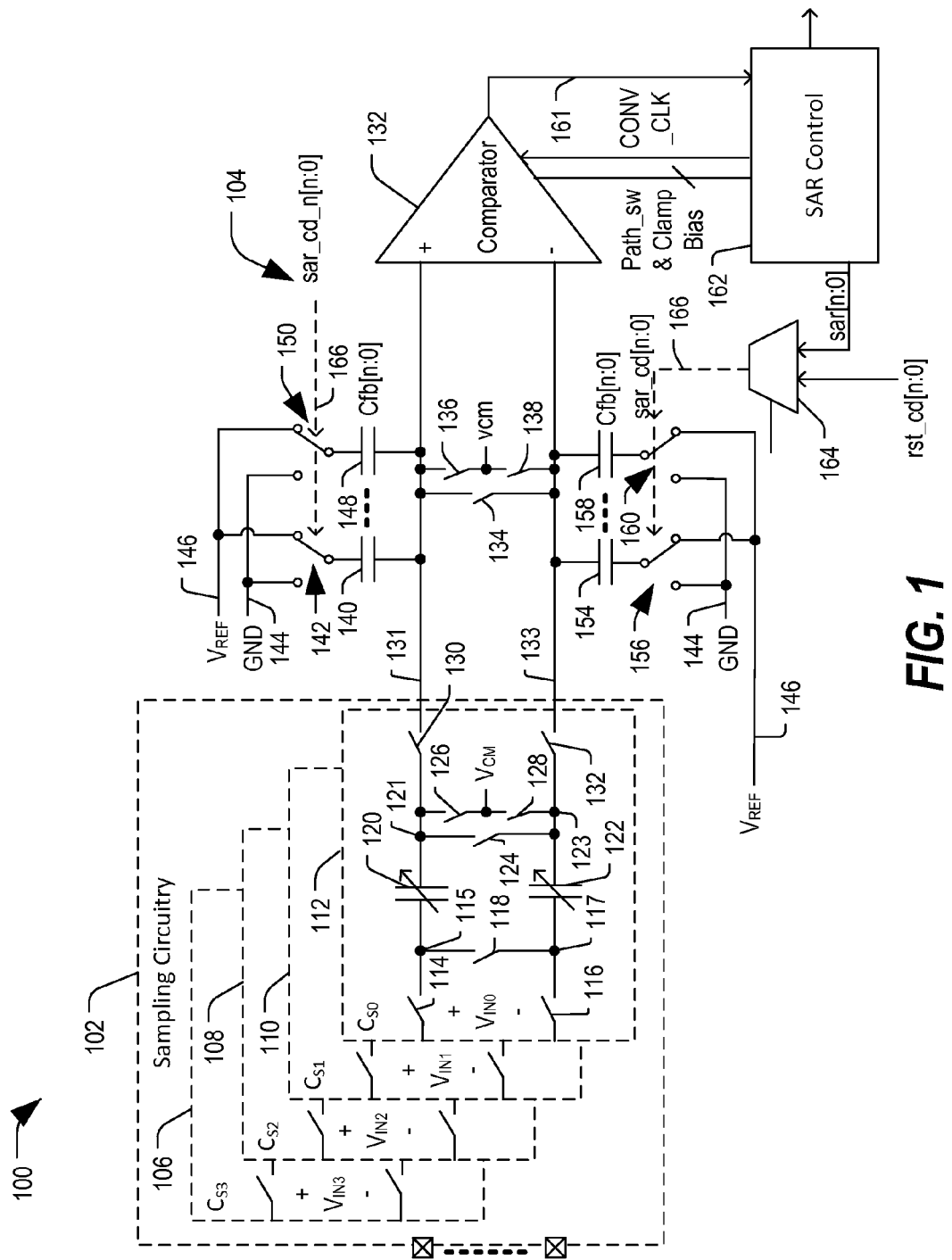
FIG. 1 is a diagram of an embodiment of a successive approximation register (SAR) ADC including a dual-path comparator according to an embodiment.

FIG. 1 is a diagram of an embodiment of an SAR ADC 100 including a dual-path comparator 132 according to an embodiment. SAR ADC 100 includes sampling circuitry 102 and feedback circuitry 104. Sampling circuitry 102 includes multiple capacitive sampling circuits 106, 108, 110, and 112 (labeled "$C_{S0}$", "$C_{S1}$", "$C_{S2}$", and "$C_{S3}$"). While the illustrated embodiment depicts four capacitive sampling circuits 106, 108, 110, and 112, sampling circuitry 102 may include any number of capacitive sampling circuits. Each of the multiple sampling circuits 106, 108, 110, and 112 may be coupled to a signal source (such as a conductive trace or circuit) configured to provide a signal.

Capacitive sampling circuit 112 includes a switch 114 coupled between a pin or pad and a node 115. Capacitive sampling circuit 112 further includes a switch 116 coupled between a pin or pad and a node 117. Capacitive sampling circuit 112 includes a switch 118 coupled between node 115 and node 117. Capacitive sampling circuit 112 further includes a capacitor 120 coupled between node 115 and a node 121. Capacitive sampling circuit 112 further includes a capacitor 122 coupled between node 117 and a node 123. Capacitive sampling circuit 112 includes a switch 124 coupled between node 121 and node 123. Further, capacitive sampling circuit 112 includes a switch 126 coupled between node 121 and a bias node (labeled "$V_{CM}$"), which may be configured to provide a common mode voltage. In the illustrated embodiment, each of the bias nodes is labeled as "$V_{CM}$", which assumes a common mode voltage. In some embodiments, the bias nodes may receive a selected voltage other than the common mode voltage.

Capacitive sampling circuit 112 further includes a switch 128 coupled between the bias node and node 123. Capacitive sampling circuit 112 further includes a conversion switch 130 coupled between node 121 and a node 131, and includes a conversion switch 132 coupled between node 123 and node 133. Capacitive sampling circuits 106, 108, and 110 have similar switches and capacitors to provide the same functionality as capacitive sampling circuit 112 for a different set of inputs.

Feedback circuitry 104 includes a comparator 132 having a positive input coupled to node 131 and a negative input coupled to node 133. Comparator 132 includes a dual-path architecture that has a first (coarse) path and a second (fine) path, which paths have different granularity with respect to their levels of accuracy and the amount of charge they are configured to compare. In particular, the first or coarse path is configured to compare relatively high voltages (for example, in one possible non-limiting embodiment, the relatively high voltages may be differential voltages within a range of 1.2 volts to 0.1 volts), while the second or fine path is configured to compare relatively small voltages (for example, differential voltages less than 0.1 volts). The second or fine path may be used at the end of the SAR operation and may define the final accuracy of the SAR ADC.

Comparator 132 further includes one or more switches configured to route the differential voltage on nodes 131 and 133 to a selected one of the paths. In an example, during a first portion of a conversion process, the switch may be enabled to direct the differential voltage to the coarse path to determine the most significant bits and, during a second portion of the conversion process, the switch may be enabled to direct the differential voltage to the fine path to determine the least significant bits.

Feedback circuitry 104 includes a switch 134 coupled between node 131 and node 133. When switch 134 is closed, switch 134 shorts the inputs of comparator 132. Feedback circuitry 104 further includes a switch 136 coupled between node 131 and a bias node (labeled "$V_{CM}$"), which is configured to provide a common mode voltage that can be used to reset the feedback capacitors. Feedback circuitry 104 also includes a switch 138 coupled between node 133 and the bias node.

Feedback circuitry 104 further includes a feedback capacitor 140 coupled between node 131 and a switch 142. Switch 142 is coupled between node 131 and a node 144 (labeled "GND") and is coupled to a reference node 146 (labeled "$V_{REF}$"). In the illustrated embodiment, node 144 may be a power supply terminal to provide a reference signal, such as a second reference voltage rather than ground. In an embodiment, nodes 144 and 146 provide first and second reference voltages. In another embodiment, node 144 provides a negative reference voltage, and reference node 146 provides a positive reference voltage.

Feedback circuitry 104 further includes a feedback capacitor 148 coupled between node 131 and a switch 150. Switch 150 is coupled between node 131 and node 144 and is coupled to reference node 146. While two feedback capacitors 140 and 148 are shown, feedback circuitry 104 may include any number of feedback capacitors.

Feedback circuitry 104 includes a capacitor 154 coupled between node 133 and a switch 156, which is coupled between node 133 and node 144. Switch 156 is also coupled to a reference node 146. Feedback circuitry 104 also includes a capacitor 158 coupled between node 133 and a switch 160, which is coupled between node 133 and node 144. Switch 160 is also coupled to reference node 146. While two capacitors 154 and 158 are shown, feedback circuitry 104 may include additional capacitors.

Comparator 132 includes an output coupled to a successive approximation register (SAR) control circuit 162, which includes an output coupled to an input of a multiplexer 164 to provide an SAR signal labeled "sar[n:0]". Multiplexer 164 includes a second input configured to receive a reset code (labeled "rst_cd[n:0]"), a control input to receive a select signal, and an output 166 configured to provide a switch control signal (labeled "sar_cd[n:0]" to switches 156 and 160. Additionally, the SAR control circuit 162 provides an inverted version of the SAR switch control signal (labeled "sar_cd_n[n:0]") to switches 142 and 150. SAR control circuit 162 further includes an output configured to provide a conversion clock signal (labeled "conv_clk") to comparator 132, and includes an output configured to provide a path switch signal (labeled "Path_sw") and a clamp bias signal to comparator 132 to control the routing of the differential voltage during conversion.

In an embodiment, comparator 132 provides a dual-path architecture that allows for conversion of MSBs through a coarse conversion path and conversion of LSBs through a fine conversion path. Comparator 132 may be implemented using a radix less than two to allow redundancy in the conversion operation to resolve mismatch errors in the dual paths. Further, as explained below, the dual-path comparator 132 operates to suppress transient MOS field effect transistor (MOSFET) threshold voltage shifts.

In an embodiment, comparator 132 is configured to dynamically switch to a coarse path for an initial few MSB comparison steps in SAR ADC 100, when the differential input voltage is large (such as above a first threshold). During a first portion of a conversion phase, SAR control circuit 162 provides a path switch control signal (Path_sw) to direct the differential voltage to the coarse path and to suppress the input gate-to-source voltage ($V_{GS}$) in the fine path, which is used at the end of SAR operation and decides the final accuracy. The clamp bias signal biases a MOSFET clamp, rather than a typical diode connected clamp, to clamp the output of at least the first gain stage of the fine-path to a low level to reduce the $V_{GS}$ stress on subsequent gain stages.

As mentioned above, comparator 132 uses a radix less than two (as opposed to a radix equals 2 implementation) at least for the initial few MSB transitions to provide redundancy so that comparator 132 can handle mismatch errors within and between the dual paths. An example of an embodiment of comparator 132 is described below with respect to FIG. 2.

Figure 2:
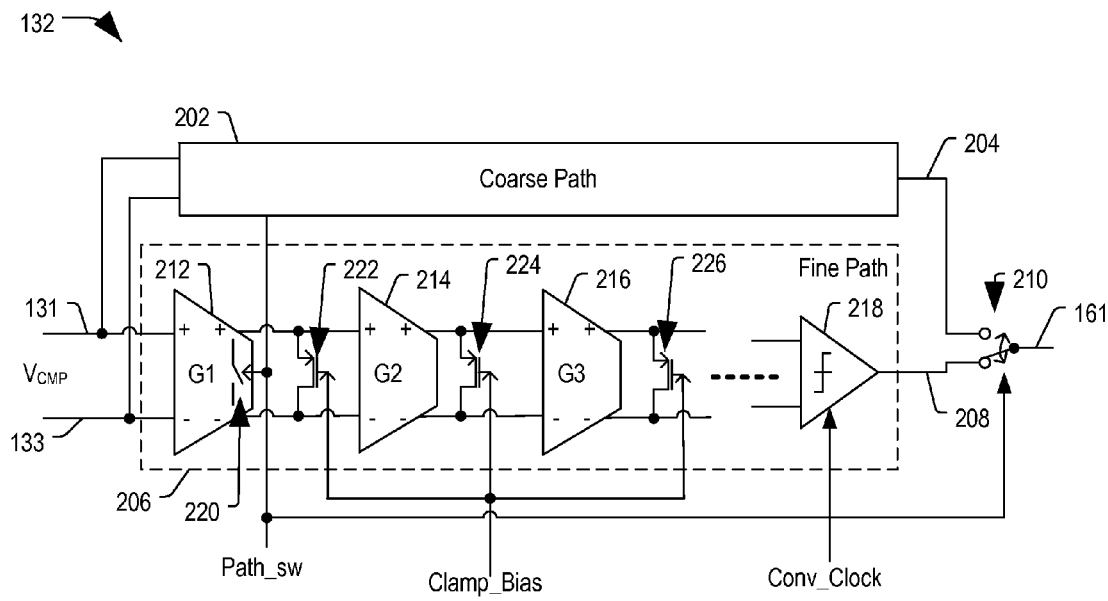
FIG. 2 is a diagram of a dual-path comparator according to an embodiment.

FIG. 2 is a diagram of a dual-path comparator 132 according to an embodiment. Comparator 132 includes a coarse path 202 coupled between nodes 131 and 133 and a node 204. Further, comparator 132 includes a fine path 206 coupled between nodes 131 and 133 and a node 208. Comparator 132 further includes a switch 210 including a first terminal coupled to node 204, a second terminal coupled to node 208, and a third terminal coupled to output node 161, which may be coupled to an input of SAR control circuit 162 in FIG. 1. Switch 210 is responsive to a path switch control signal (Path_sw) to selectively couple output node 161 to one of nodes 204 and 208.

Fine path 206 includes a plurality of amplifiers in a series. Fine path 206 includes an amplifier (first gain stage) 212 including a first input coupled to node 131, a second input coupled to node 133, and first and second outputs coupled to first and second inputs of an amplifier 214. Amplifier 212 includes a path switch 220 coupled between the first and second outputs. Path switch 220 is responsive to the path switch control signal (Path_sw). Amplifier 214 includes first and second outputs coupled to first and second inputs of amplifier 216, which has first and second outputs. Fine path 206 may include any number of amplifiers, depending on the implementation. A last amplifier in the series includes first and second outputs coupled to first and second inputs of a comparator 218, which includes a clock input configured to receive a conversion clock signal from SAR control circuit 162 and which includes an output coupled to node 208.

Fine path 206 further includes a transistor 222 including a source coupled to the first output of amplifier 212, a drain coupled to the second output of amplifier 212, and a gate configured to receive a clamp bias signal (Clamp_Bias) from SAR control circuit 162. Fine path 206 may also include a transistor 224 including a source coupled to the first output of amplifier 214, a drain coupled to the second output of amplifier 214, and a gate configured to receive the clamp bias signal (Clamp_Bias) from SAR control circuit 162. Fine path 206 may further include a transistor 226 including a source coupled to the first output of amplifier 216, a drain coupled to the second output of amplifier 216, and a gate configured to receive the clamp bias signal (Clamp_Bias).

In an embodiment, during a conversion operation, SAR control circuit 162 controls timing of the conversion based on conversion clock signal (Conv_Clock) and controls path selection within dual-path comparator 132. During a first portion of the converson operation corresponding to an initial number of MSBs, SAR control circuit 162 applies the path switch signal (Path_sw) to enable the coarse path 202, to activate switch 220 to disable the fine path 206, and to activate switch 210 to couple node 204 to output node 161. The clamp bias signal (Clamp_Bias) may also be applied by SAR control circuit 162 to bias transistors 222, 224, and/or 226 to clamp output voltages of amplifiers 212, 214, and 216, protecting fine path 206 from relatively high amplified voltages from the differential input voltage ($V_{CMP}$). After the first few MSBs, the differential voltage is sufficiently small that the fine path may be used. In an example, the coarse path 202 is used when the comparator input is large to determine the initial a few MSBs, while the fine path 206 is disabled (protected from gate-to-source voltage ($V_{GS}$) stress).

After a few MSBs, the comparator input signal is scaled down enough to safely switch back to the fine path 206. The number of MSBs processed using coarse path 202 may be determined based on the comparator voltage input level, such that when the comparator voltage input level falls below a pre-determined threshold, fine path 206 is activated. SAR control circuit 162 controls comparator 132 to enter a second phase or portion of the conversion operation. During this second portion of the conversion operation corresponding to a remaining number of bits, SAR control circuit 162 applies the path switch signal (Path_sw) to disable coarse path 202, to enable fine path 206, and to enable switch 210 to couple node 208 to output node 161.

Thus, the relatively high voltage representing the MSBs of the input signal may stress transistors and other circuit components within coarse path 202, which may demonstrate the transient MOS threshold voltage shift. However, errors and/or offsets introduced by such a shift can be reduced or eliminated when SAR control circuit 162 switches to fine path 206 to finish the conversion.

In an embodiment, comparator 132 uses a radix of less than two, rather than a radix of two, to provide extra redundancy so that comparator 132 can handle mismatch errors between coarse path 202 and fine path 206. In particular, the capacitors within the ADC may be selected to have a capacitance that varies from a next capacitance by an exponent (radix) that is less than 2 (e.g., $C^{1.8N}$, where N represents the index of the capacitor, e.g., N=0, 1, 2, ... ).

The conversion operation, as discussed above, includes a first phase corresponding to conversion of the MSBs and a second phase corresponding to conversion of the LSBs. One possible example of the timing of control signals configured to control comparator 132 to provide a dual-path conversion is described below with respect to FIG. 3.

Figure 3:
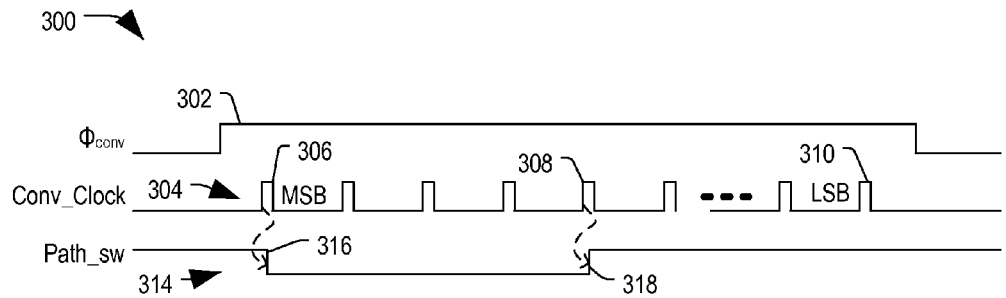
FIG. 3 is a timing diagram of conversion phase, conversion clock, and path switching signals used in connection with the dual-path comparator of FIG. 2 according to an embodiment.

FIG. 3 is a timing diagram 300 of conversion phase, conversion clock, and path switching signals used in connection with the dual-path comparator of FIG. 2 according to an embodiment. Timing diagram 300 includes a conversion phase signal 302, which transitions from a logic low level to a logic high level, and which remains at a logic high level throughout the conversion operation. Timing diagram 300 further includes a conversion clock signal, generally indicated at 304, and the path switch control signal (Path_sw), generally indicated at 314. Path switch control signal 314 is pulled to a logic low level at the first conversion clock pulse 306 after the transition edge of the conversion phase signal 302, as indicated at 316. Path switch control signal 314 disables the fine path 206 and selects the coarse path 202. During this first portion of the conversion phase, the MSBs are represented by a relatively large input voltage, which is converted by coarse path 202. The conversion of the MSBs is performed by the coarse path 202 for a number of bits (k) until the differential input voltage falls below a pre-determined level.

After the k number of MSBs are converted, the path switch control signal 314 transitions from a logic low level to a logic high level, disabling coarse path 202 and enabling fine path 206 as indicated at 318. At this point, the differential input voltage is low enough to avoid transient MOS threshold shifts. The path switch control signal 314 remains at a logic high level at least through conversion of LSBs, such as bit 310, and possibly until a next bit sequence is received.

In the above-examples, operation of dual-path comparator 132 and timing of corresponding signals were described. The operation may be further understood in view of the range of the differential input voltages for each bit value as well as the mismatch error tolerance resulting from the dual-path comparator 132 used in conjunction with a capacitive sampling network having a radix less than two. One possible example of the differential input voltage range of comparator 132 over a sequence of conversion steps is described below with respect to FIG. 4.

Figure 4:
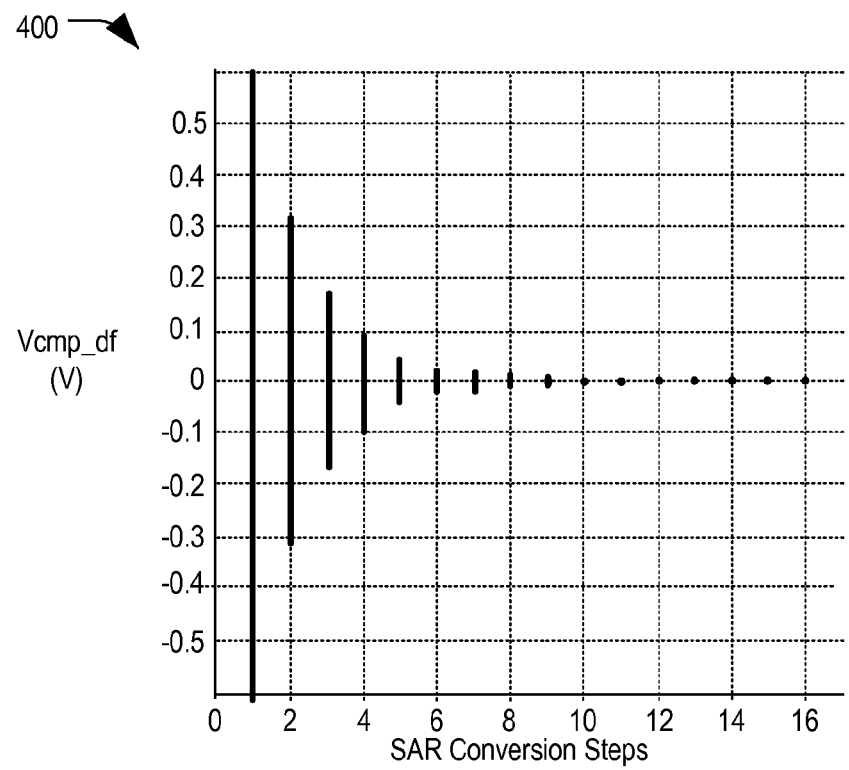
FIG. 4 is a graph of comparator voltage input range (in volts) versus SAR conversion steps for the dual-path comparator of FIG. 2 according to an embodiment.

FIG. 4 is a graph 400 of comparator voltage input range (in volts) versus SAR conversion steps for the dual-path comparator of FIG. 2 according to an embodiment. In the first conversion step, the differential input voltage range is greater than 1 volt. In the second conversion step, the differential input voltage has fallen to approximately 0.6 volts. By the fifth conversion step, the differential input voltage has fallen to approximately 100 mV. In this example, SAR control circuit 162 may control comparator 132 to use coarse path 202 to convert the first four or five bits and then switch to fine path 206 for conversion steps 6-16. In this way, coarse path 202 will experience the MOS stress that may result in a transient MOSFET threshold voltage shift, but the shift can be eliminated when fine path 206 is switched in to complete the conversion.

In the illustrated example, the MSBs (such as those corresponding to conversion steps 1-4 or so) may be converted using coarse path 202. Using a radix less than two for at least the first few MSBs provides redundancy that can be used to handle mismatch errors within and between the conversion paths 202 and 206. Accordingly, comparator 132 can handle large errors in early conversion steps and has an exponentially decreasing tolerance with each conversion step as depicted in FIG. 5.

Figure 5:
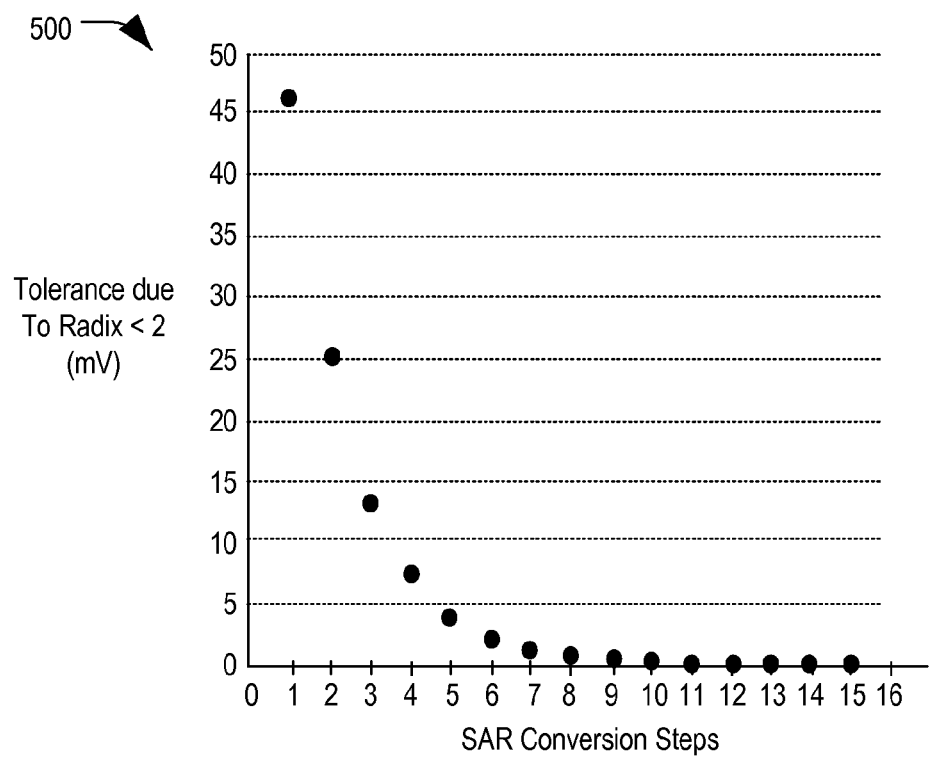
FIG. 5 is a graph of tolerance (in millivolts) versus SAR conversion steps for the dual-path comparator of FIG. 2 using a radix less than two implementation according to an embodiment.

FIG. 5 is a graph 500 of tolerance (in millivolts) versus SAR conversion steps for the dual-path comparator of FIG. 2 using a radix less than two implementation according to an embodiment. As depicted, during the first few conversion steps, the error tolerance is relatively large (46 mV for the first step, 25 mV for the second step, and 13 mV for the third step, etc.), representing the possibility that the transient MOS threshold shift may impact the accuracy. However, the error tolerance decreases exponentially over the number of conversion steps, representing conversion using fine path 206, which can eliminate or reduce the errors once SAR control circuit 162 selects fine path 206.

Figure 6:
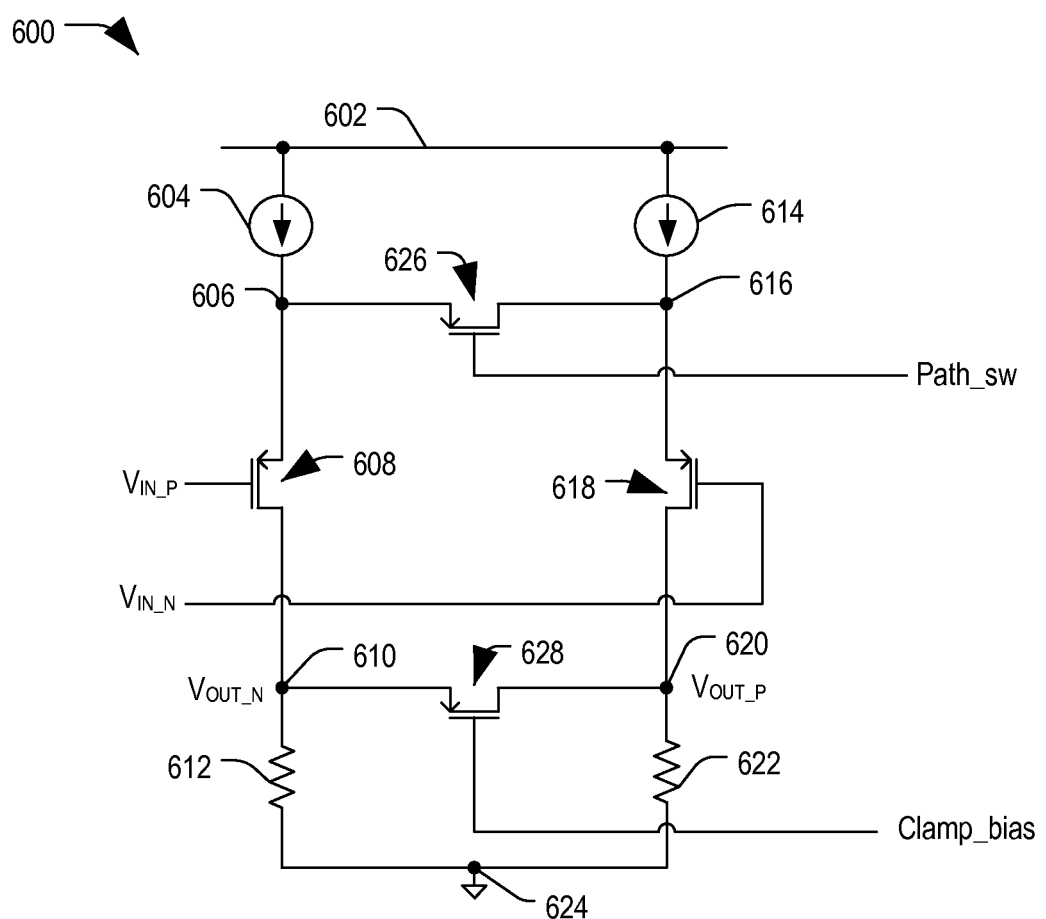
FIG. 6 is a circuit diagram of a first gain stage of a fine path within the dual-path comparator of FIGS. 1 and 2 according to an embodiment.

FIG. 6 is a circuit diagram of a first gain stage 212 of fine path 206 within dual-path comparator 132 of FIGS. 1 and 2 according to an embodiment. First gain stage 212 includes a current source 604 coupled between power supply node 602 and a node 606. First gain stage 212 further includes a transistor 608 has a source coupled to node 606, a drain coupled to node 610 (a negative output node labeled "$V_{OUT\_N}$"), and a gate configured to receive a first input voltage (labeled "$V_{OUT\_P}$"). First gain stage further includes a resistor 612 coupled between nodes 610 and 624. Node 624 may be a power supply node, such as a ground node.

First gain stage 212 also includes a current source 614 coupled between node 602 and a node 616. First gain stage 212 further includes a transistor 618 including a source coupled to node 616, a drain coupled to a node 620 (a positive output node labeled "$V_{OUT\_P}$"), and a gate configured to receive a second input voltage (labeled "$V_{IN\_N}$"). First gain stage 212 also includes a resistor 622 coupled between nodes 620 and 624.

First gain stage 212 further includes a path switch transistor 626 (such as transistor 220 in FIG. 2) including a source coupled to node 606, a drain coupled to node 616, and a gate configured to receive the path switch control signal (Path_sw). First gain stage 212 further includes a clamp transistor 628 including a source coupled to node 610, a drain coupled to node 620, and a gate configured to receive the clamp bias signal (Clamp_Bias). Clamp bias signal may be approximately equal to the common mode output voltage ($V_{OUT\_CM}=V_{OUT\_P}-V_{OUT\_N}$) minus the threshold voltage (Vth), which biases transistor 628 to clamp the differential output voltage to a low level to prevent stressing the MOSFETs in amplifiers of fine path 206.

In general, path switch transistor 626 and clamp transistor 628 operate to limit imbalances and large gate-to-source voltage ($V_{GS}$) stresses across transistors 608 and 618 and at the inputs of subsequent gain stages. In one example, such large $V_{GS}$ stresses can include voltages in excess of 1.2 volts. One example of the gate-to-source voltages for transistors 608 and 618 when the path switch transistor 626 is used to keep fine path 206 from large and imbalanced and relatively large MOS gate-to-source voltage stress is described below with respect to FIG. 7.

Figure 7:
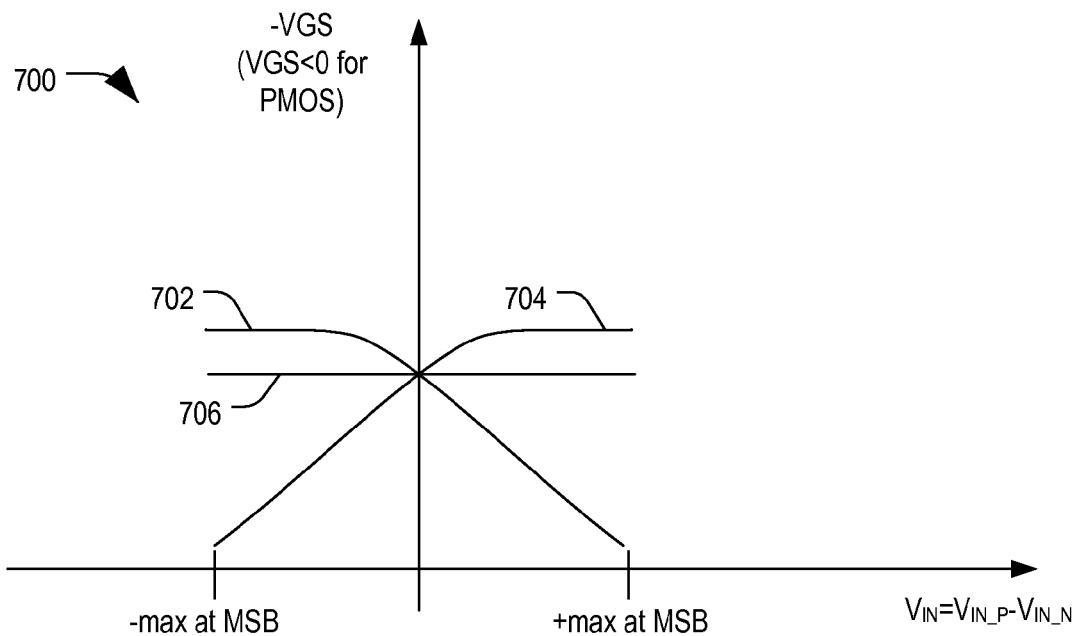
FIG. 7 is a graph of the gate-to-source voltage ($V_{GS}$) versus input voltage for the first gain stage of the fine path within the dual-path comparator of FIG. 2 according to an embodiment.

FIG. 7 is a graph 700 of the gate-to-source voltage ($V_{GS}$) versus input voltage for the first gain stage 212 of fine path 206 within the dual-path comparator 132 of FIG. 2 according to an embodiment. In graph 700, the $V_{GS}$ of the PMOS transistors 608 and 618 are less than zero. The $V_{GS}$ of transistor 608 is generally indicated at 702, and the $V_{GS}$ of transistor 618 is generally indicated at 704. The $V_{GS}$ of transistors 608 and 618 are approximately equal when the path switch 626 is disabled.

Further, the output voltage swing at the outputs of first gain stage (amplifier) 212 may also be limited using clamp transistor 628. An example of the output voltage swing with and without enabling clamp transistor 628 is described below with respect to FIG. 8.

Figure 8:
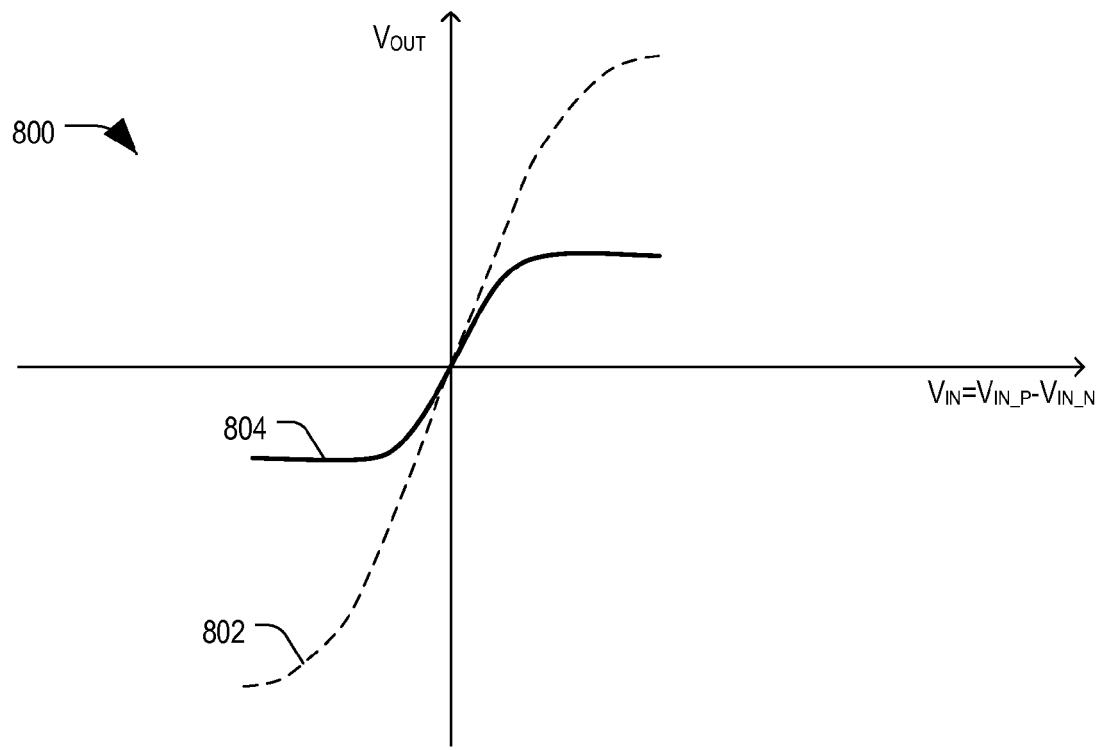
FIG. 8 is a graph of the output voltage ($V_{GS}$) versus input voltage for the first gain stage of the fine path within the dual-path comparator of FIG. 2 according to an embodiment.

FIG. 8 is a graph 800 of the output voltage ($V_{OUT}$) versus the input voltage for the first gain stage 212 of fine path 206 within the dual-path comparator 132 of FIG. 2 according to an embodiment. As shown, without enabling transistor 628, the outputs of first gain stage 212 would demonstrate a large output voltage swing, generally indicated at 802. In one example, a large voltage swing may be a voltage change that is greater than 1.2 volts. In another example, a large voltage swing may be a voltage change of 2 volts or more. However, SAR control circuit 162 can provide a clamp bias signal to enable transistor 628, limiting the output voltage as depicted at 804.

Transistor 628 may be activated to couple the drains of transistors 608 and 618. By coupling the drains of transistors 608 and 618, reducing the differential output voltage ($V_{OUT\_P}-V_{OUT\_N}$) is reduced, thereby reducing the voltage swing.

Figure 9:
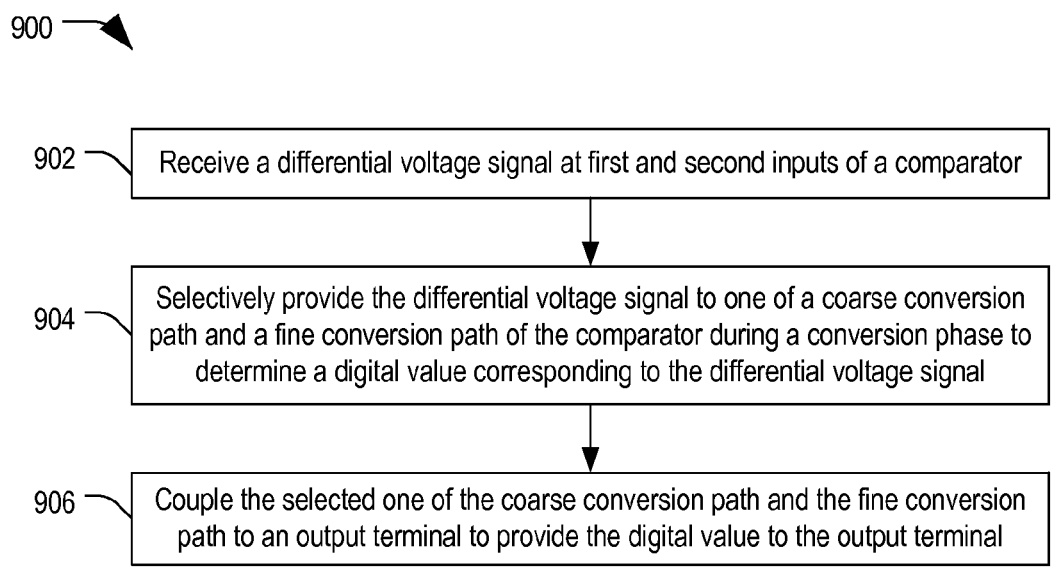
FIG. 9 is a flow diagram of method of performing an analog-to-digital conversion using a dual-path comparator according to an embodiment.

FIG. 9 is a flow diagram of method 900 of performing an analog-to-digital conversion using a dual-path comparator according to an embodiment. At 902, a differential voltage signal is received at first and second inputs of a comparator. Advancing to 904, the differential voltage signal is selectively provided to one of a coarse conversion path and a fine conversion path of the comparator during a conversion phase to determine a digital value corresponding to the differential voltage signal. In an embodiment, the differential voltage signal is selectively provided to the coarse conversion path during a first portion of a conversion period and to the fine conversion path during a second portion of the conversion period. The first portion of the conversion period may be shorter than the second portion of the conversion period. In an example, the first portion of the conversion period may correspond to conversion of a number of most significant bits of the digital value. The fine conversion path may be disabled during a first portion of the conversion period. Additionally, a transistor may be biased to couple a first output of a first gain stage of the fine conversion path to a second output of the first gain stage during the first portion of the conversion period. In a second portion of the conversion period, the fine conversion path may be enabled by controlling a switch to couple the fine conversion path to the output.

Continuing to 906, the selected one of the coarse conversion path and the fine conversion path is coupled to an output to provide the digital value to the output. In an example, coupling the selected one of the coarse conversion path and the fine conversion path to the output includes biasing a switch to couple the coarse conversion path to the output.

In conjunction with the circuits and methods described above with respect to FIGS. 1-9, a dual-path comparator may be used within a SAR ADC to provide digital output values while suppressing transient MOSFET threshold voltage shifts. In an embodiment, the dual-path comparator includes a first conversion path and a second conversion path and is configured to selectively provide a differential input voltage to one of the first and second conversion paths during a conversion period. In an example, the comparator converts MSBs of the differential input voltage using the first conversion path (during a first portion of the conversion period) and converts LSBs of the differential input voltage using the second conversion path (during a second portion of the conversion period).

It is to be understood that, even though characteristics and advantages of the various embodiments have been set forth above, together with details of the structure and function of various embodiments, changes may be made in details, especially in the matters of structure and arrangement of parts within principles of the present disclosure to the full extent indicated by the broad meaning of the terms in which the appended claims are expressed. For example, while transistors have been depicted and described by their drain, source, and gate connections, it should be appreciated that, in some instances, other switching devices may also be used. For example, N-channel metal oxide semiconductor field effect transistors (NMOSFETs) may be substituted for P-channel MOSFETs, with corresponding changes to drive signals, without departing from the scope of this disclosure. Further, the particular components or elements may vary depending on the particular application for the comparator while maintaining substantially the same functionality without departing from the scope and spirit of the disclosure. In addition, while the above-discussion focused on converting a first few MSBs using a coarse path and remaining bits using a fine path, it will be appreciated by those skilled in the art that the teachings disclosed herein, including the number of MSBs processed using the coarse path, may be varied according to the particular application.

Although the present invention has been described with reference to preferred embodiments, workers skilled in the art will recognize that changes may be made in form and detail without departing from the scope of the invention.

What is claimed is:

1. A method comprising:
    receiving a differential voltage signal at first and second inputs of a comparator;
    selectively providing the differential voltage signal to one of a first conversion path and a second conversion path of the comparator during a conversion phase to determine a digital value corresponding to the differential voltage signal, the first and second conversion paths including first and second pluralities of gain stages; and
    coupling the selected one of the first conversion path and the second conversion path to an output to provide the digital value.

2. The method of claim 1, wherein selectively providing the differential voltage signal to one of the first conversion path and the second conversion path comprises:
    providing the differential voltage signal to the first conversion path during a first portion of a conversion period; and
    providing the differential voltage signal to the second conversion path during a second portion of the conversion period.

3. The method of claim 2, wherein the first portion of the conversion period is shorter than the second portion of the conversion period.

4. The method of claim 2, wherein the first portion of the conversion period corresponds to conversion of a first number of most significant bits of the digital value.

5. The method of claim 1, wherein selectively providing the differential voltage signal to the first conversion path comprises disabling the second conversion path during a first portion of the conversion period.

6. The method of claim 5, further comprising biasing a transistor to couple first and second outputs of a first gain stage of the second plurality of gain stages to each other during the first portion of the conversion period.

7. The method of claim 1, wherein coupling the selected one of the first conversion path and the second conversion path to the output comprises biasing a switch to couple the first conversion path to the output.

8. The method of claim 1, wherein selectively providing the differential voltage signal to the second conversion path comprises enabling the second conversion path and causing a switch to couple the second conversion path to the output.

9. A dual-path comparator comprising:
    first and second inputs to receive a differential input signal;
    a first path including a first plurality of gain stages, the first path configured to be coupled to the first and second inputs during a first portion of a conversion period;
    a second path including a second plurality of gain stages, the second path configured to be coupled to the first and second inputs during a second portion of a conversion period; and
    an output switch configured to selectively couple one of the first path and the second path to an output node.

10. The dual-path comparator of claim 9, wherein:
    the first path is configured to convert most significant bits of the differential input signal during the first portion; and
    the second path is configured to convert least significant bits of the differential input signal during the second portion.

11. The dual-path comparator of claim 9, wherein the first portion of the conversion period is shorter than the second portion of the conversion period.

12. The dual-path comparator of claim 9, further comprising a path select switch configured to disable the second path during the first portion and to enable the second path during the second portion.

13. The dual-path comparator of claim 9, further comprising a clamp switch responsive to a clamp bias signal to selectively couple outputs of at least a first gain stage of the second path during the first portion of the conversion period.

14. The dual-path comparator of claim 9, wherein the second path comprises:

a first gain stage including first and second inputs to receive the differential input signal, a path selection input, a clamp bias input, and first and second outputs; and at least one second gain stage coupled between the first and second outputs of the first gain stage and the second output node.

15. The dual-path comparator of claim 14, wherein the first gain stage is responsive to the path selection input to disable the second path during the first portion of the conversion period and to enable the second path during the second portion of the conversion period.

16. The dual-path comparator of claim 14, wherein the first gain stage is responsive to the clamp bias input to clamp the first output of the first gain stage to the second output of the first gain stage.

17. An analog-to-digital converter comprising:

first and second inputs to receive a differential input signal; and a comparator including:

a first path including a first plurality of gain stages and configured to be coupled to the first and second inputs during a first portion of a conversion period;

a second path including a second plurality of gain stages and configured to be coupled to the first and second inputs during a second portion of a conversion period; and a path select switch configured to couple the first and second inputs to the first path during the first portion and to couple the first and second inputs to the second path during the second portion.

18. The analog-to-digital converter of claim 17, further comprising an output switch coupled between the first and second paths and an output node, the output switch configured to selectively couple one of the first path and the second path to the output node in response to a control signal.

19. The analog-to-digital converter of claim 17, wherein the path select switch is configured to disable the second path during the first portion and to enable the second path during the second portion.

20. The analog-to-digital converter of claim 17, wherein:

the first path is configured to convert most significant bits of the differential input signal during the first portion; and the second path is configured to convert least significant bits of the differential input signal during the second portion.

* * * * *